(12) United States Patent
Carter

(10) Patent No.: US 7,444,249 B2
(45) Date of Patent: Oct. 28, 2008

(54) DIGITAL POWER METERING SYSTEM FOR REDUCING SPECTRAL LEAKAGE WHEN DETERMINING THE FREQUENCIES PRESENT IN A POWER SIGNAL

(75) Inventor: Ronald W. Carter, Murfreesboro, TN (US)

(73) Assignee: Square D Company, Palatine, IL (US)

( * ) Notice: Subject to any disclaimer, the term of this patent is extended or adjusted under 35 U.S.C. 154(b) by 713 days.

(21) Appl. No.: 11/106,889

(22) Filed: Apr. 15, 2005

(65) Prior Publication Data

US 2006/0235631 A1 Oct. 19, 2006

(51) Int. Cl.
G01R 23/00 (2006.01)

(52) U.S. Cl. .............. 702/75; 702/60; 702/76; 702/77

(58) Field of Classification Search .......... 702/60, 702/75–77
See application file for complete search history.

(56) References Cited

U.S. PATENT DOCUMENTS

| | | | |
|---|---|---|---|
| 6,016,112 A | 1/2000 | Knudsen | |
| 6,185,508 B1 | 2/2001 | Van Doorn et al. | |
| 6,687,630 B2 | 2/2004 | Dionne | |
| 2003/0014203 A1 | 1/2003 | Dionne | |
| 2004/0260471 A1 | 12/2004 | McDermott | |
| 2005/0038942 A1 | 2/2005 | Swanson | |

*Primary Examiner*—John E. Barlow, Jr.
*Assistant Examiner*—Stephen J Cherry

(57) ABSTRACT

A digital power metering system reduces spectral leakage when determining the frequencies present in a power signal by a technique that includes sampling the signal and performing a transformation from the time domain to the frequency domain. The system initially measures the fundamental frequency of the power signal, and samples the power signal at a known sampling rate to produce digital sample values representing the power signal. The system then determines whether the known sampling rate is within a preselected range of a rate that is coherent with the measured fundamental frequency. If the answer is negative, then the system resamples the signal at a rate that is coherent with the measured fundamental frequency to produce resample values representing the signal, so that the frequencies present in the power signal can be determined from the resample values.

12 Claims, 8 Drawing Sheets

DIGITAL POWER METERING SYSTEM FOR REDUCING SPECTRAL LEAKAGE WHEN DETERMINING THE FREQUENCIES PRESENT IN A POWER SIGNAL

FIELD OF THE INVENTION

The present invention relates generally to digital power metering systems and, more particularly, to a system for reducing or eliminating false spectral components that occur when determining the frequencies present in a power signal.

BACKGROUND OF THE INVENTION

In digital power metering systems it is often desirable to determine the spectral content of the power signal of interest, i.e., the spectral components that are superimposed on the fundamental frequency of the power supply system, which is typically at 50 Hz or 60 Hz. In discrete time systems this is usually done by sampling the analog power signal, converting the samples to digital values using an analog-to-digital ("A/D") converter and then performing a transformation from the time domain to the frequency domain. The tool often used to perform this transformation is the Fast Fourier Transform (FFT), although other methods may be employed.

In order for the transformation to occur error-free, it is necessary that an integer number of cycles of the signal be sampled to provide data for the FFT or any other technique used for the transformation. If this condition is not met, a phenomenon known as spectral leakage occurs. Spectral leakage produces false spectral components, i.e., a signal consisting of a single frequency should produce a single spectral line, but if leakage occurs false components will appear in the spectrum.

The spectral information is used when compensating a system to reduce harmonic content and for other troubleshooting purposes. The typical digital power meter utilizes an analog-to-digital (A/D) converter and a microprocessor, and thus all analysis is done in the discrete time or digital domain. The signal is digitized by the A/D converter operating at a sampling rate which is determined by an adjustable frequency digital clock. In order to sample an integer number of cycles of the signal (assuming the sample rate is held constant during the sampling window), it is necessary that the sample rate and the frequency of the signal be integrally related. The required sample rate is determined by measuring the frequency of the input signal and then multiplying this by some integer such that the Nyquist requirement and other system constraints are met. Because the adjustable sample clock does not have infinite precision, it is not possible to set it to the required frequency for some input frequencies.

SUMMARY OF THE INVENTION

The present invention provides a digital power metering system for reducing spectral leakage when determining the frequencies present in a power signal by a technique that includes sampling said signal and performing a transformation from the time domain to the frequency domain. The system initially measures the fundamental frequency of said power signal, and samples the power signal at a known sampling rate to produce digital sample values representing the power signal. The system then determines whether the known sampling rate is within a preselected range of a rate that is coherent with the measured fundamental frequency. If the answer is negative, then the system resamples the signal at a rate that is coherent with the measured fundamental frequency to produce resample values representing the signal, so that the frequencies present in the power signal can be determined from the resample values.

This invention provides a means of decreasing, or in some cases eliminating, the false spectral components which occur when the sample rate cannot be set to the desired value. The process employed is to reconstruct the original waveform from the samples generated by the A/D and then resample the reconstructed waveform at the appropriate frequency in firmware or software. This may be done by the process of interpolation applied to the original samples. The interpolation method used can be linear, polynomial, cubic spline, etc. Linear interpolation produces a lower computational overhead than many other methods. After the signal has been reconstituted by interpolating, the transformation from the time to the frequency domain is accomplished by applying the FFT or some other method to the interpolated data.

DETAILED DESCRIPTION OF ILLUSTRATED EMBODIMENT

Although the invention will be described in connection with a certain preferred embodiment, it will be understood that the invention is not limited to that particular embodiment. On the contrary, the invention is intended to cover all alternatives, modifications, and equivalent arrangements as may be included within the spirit and scope of the invention as defined by the appended claims.

Figure 1:
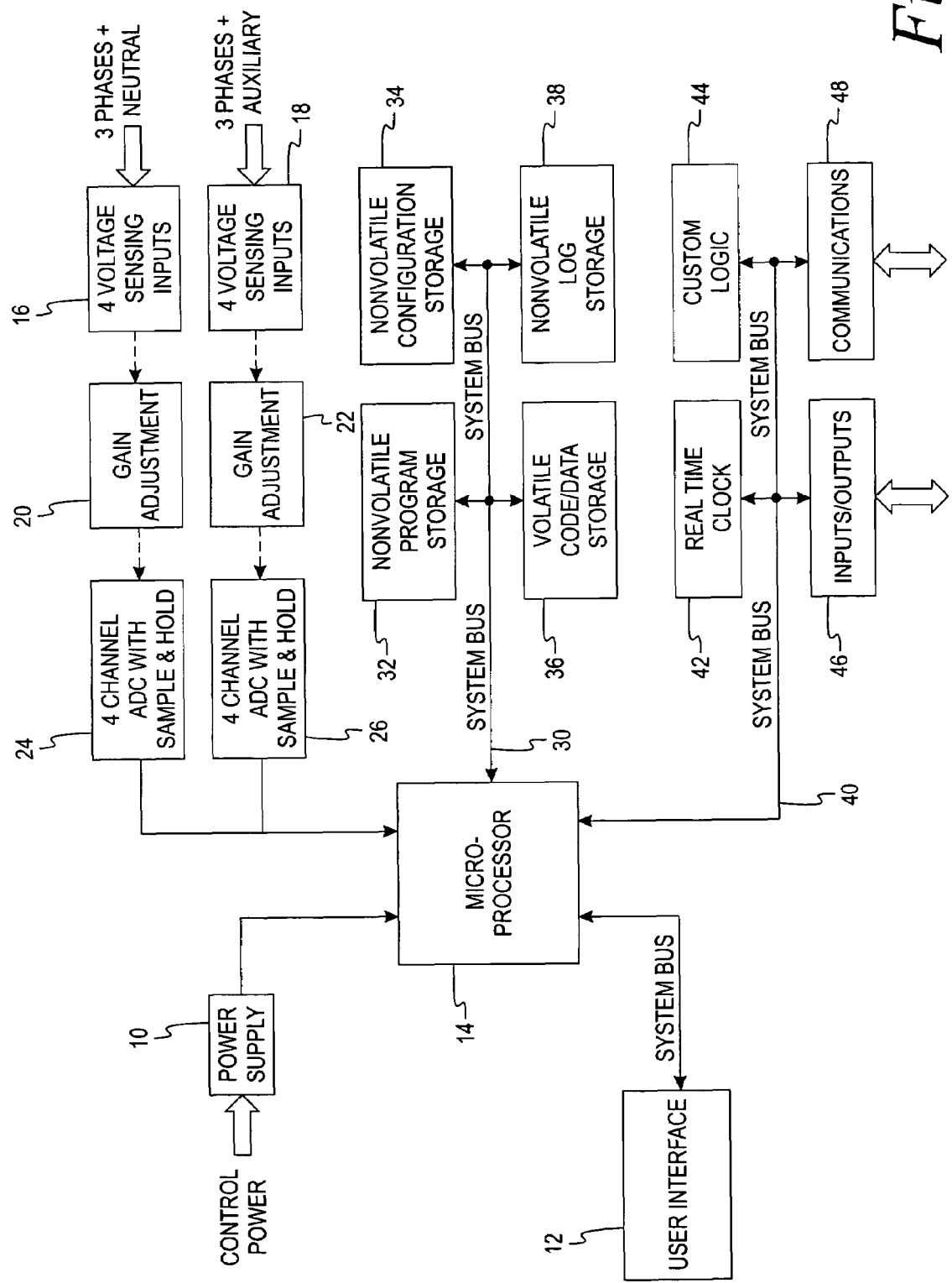
FIG. 1 is a functional block diagram of a digital power metering system.

Turning now to the drawings, FIG. 1 illustrates a typical digital power metering system or power monitor in connection with which the invention may be utilized. This power monitor could be, for example a Square D Company product, such as products designated Circuit Monitor 4000 or 4000T, Circuit Monitor 3000 Series and/or Power Meter 800 Series Meters.

Briefly, the power monitor shown in FIG. 1 includes a power supply 10 and user interface 12 both of which operatively connect with a microprocessor or controller 14. It is the controller or microprocessor 14 which controls and/or performs the major processes involved in power monitoring, and, in turn, performs the majority of the operations for determining the frequencies present in a power signal in accordance with the invention, as is more fully described below. In this regard, the microprocessor 14 may be coupled to receive a number of channels of inputs from metered values, for example, a number of voltage sensing inputs 16 and a number of current sensing inputs 18, which may come from one or more three-phase lines to be monitored, including a neutral and/or auxiliary lead. These sensing inputs 16 and 18 in turn are coupled to the microprocessor 14 by suitable gain adjustments 20 and 22 and four-channel analog-to-digital converters 24 and 26 with sample-and-hold capabilities.

One or more memory components are coupled with the microprocessor 14 via a system bus 30. These components may include nonvolatile program storage 32, nonvolatile configuration storage 34, volatile code/data storage 36 and/or nonvolatile log storage 38. A further system bus 40 may also be used to couple the microprocessor 14 with a real time clock 42 and custom logic 44, if and as required for a particular application. Various inputs and outputs 46 and communications nodes 48 may also be provided if desired in a particular monitoring application. These inputs and outputs may communicate with other similar monitors or with a master computer which polls or otherwise receives data from a number of monitors. The communications ports or devices 48 may accommodate various communications protocols such as RS232, RS-485, or ethernet.

Figure 2:
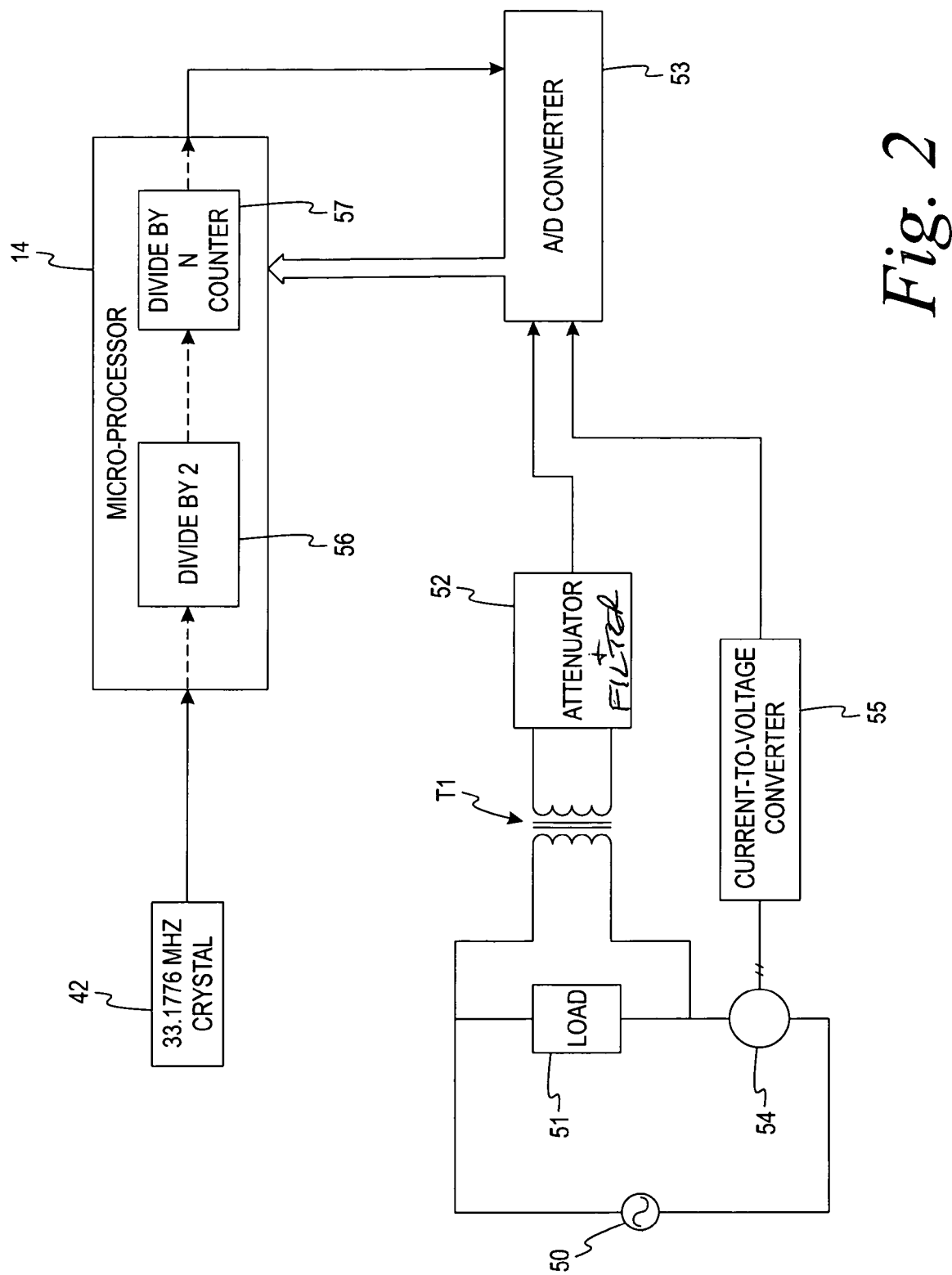
FIG. 2 is schematic diagram of a frequency measurement and control system utilized in one embodiment of the invention.

FIG. 2 illustrates one embodiment of a frequency measurement and control system for a single-phase power system, which is also typical for one phase of a three-phase system. The power signal from a source 50 supplies a load 51. The voltage across the load 51 is sensed by a transformer T1, passed through an attenuator and filter 52, and supplied to an A/D converter 53. A current sensor 54 also supplies a signal to the A/D converter, via a current-to-voltage converter 55.

Figure 3:
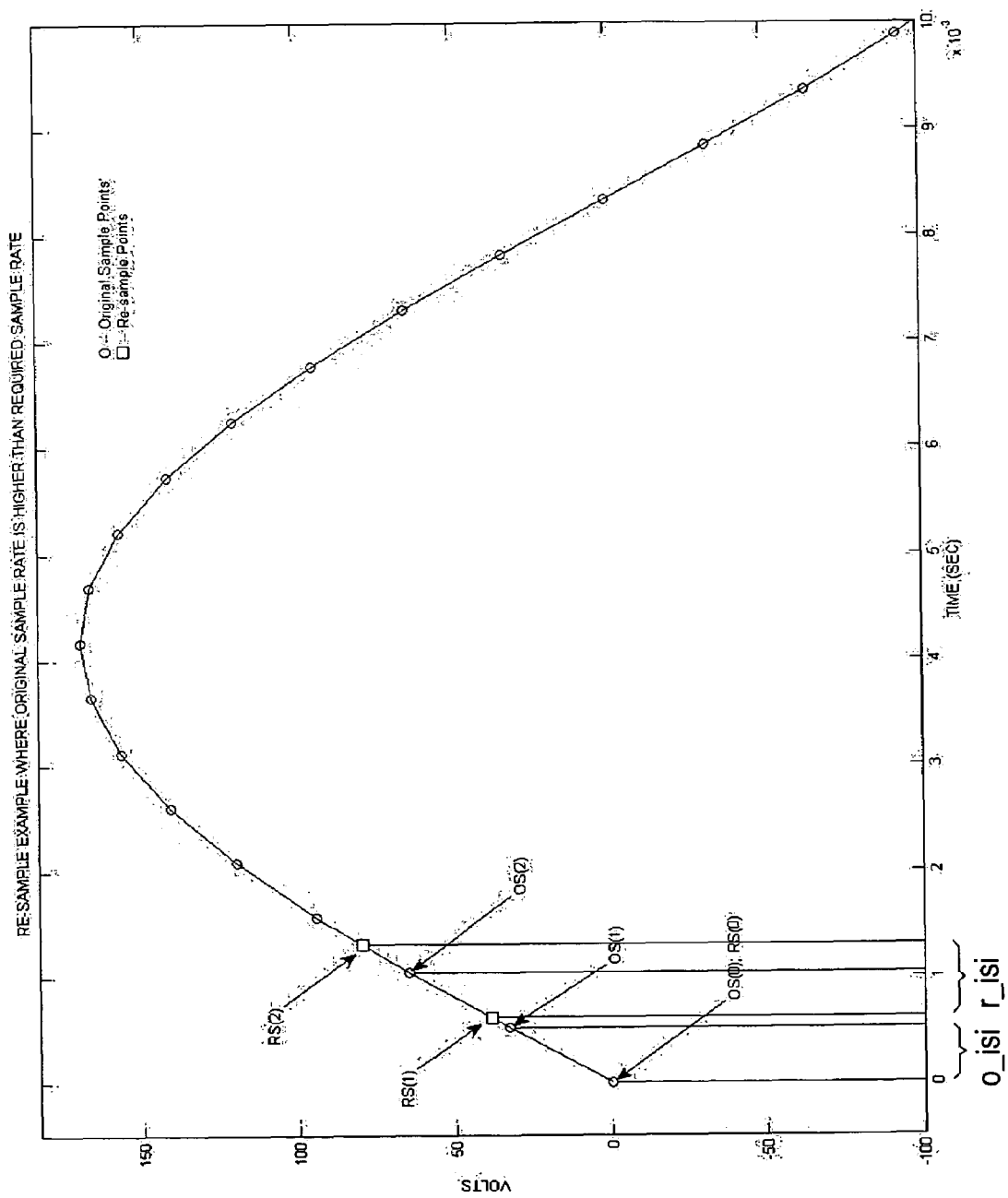
FIG. 3 is a diagram of an exemplary waveform showing both original sampling points and resampling points.

The A/D converter 53 converts the power signal from the analog domain to the digital domain, i.e., a signal represented by continuous quantities such as current or voltage is converted to signals represented by a sequence of numbers. Thus, the A/D converter 53 supplies the microprocessor 14 with a series of original samples $OS(1), OS(2), OS(3) \ldots OS(m)$, as illustrated in FIG. 3, at a known sampling frequency (rate) fs. Each group of samples is taken during a time window which is an integer multiple of the fundamental period of the system voltage. The sampling accuracy is limited by the clock 42, which in the example of FIG. 2 is a 33.1776 MHz crystal oscillator. The microprocessor divides the oscillator output by two at 56, and then by N at 57 to produce the desired control signal for the A/D converter 53. The time between the leading edge of the first sampling pulse and the leading edge of the first sampling pulse in the next time window should be equal to the duration of the specified number of cycles of the system voltage, with a maximum permissible error of ±0.03% (according to IEC 61000-4-7:2002-08).

The digitized output from the A/D converter 53 is used by the microprocessor 14 to determine the spectral content of the power signal by performing a transformation from the time domain to the frequency, typically by the use of the Fast Fourier Transform (FFT). To recover all the Fourier components of the power signal, the sampling frequency fs is preferably greater than the Nyquist frequency, which is double the highest-frequency component of the power signal.

The fundamental period of the system voltage is measured by identifying zero crossings of the waveform of the power signal, and determining the time interval between those zero crossings. The reciprocal of the fundamental period is the measured frequency, and the desired sampling frequency is a multiple of that measured frequency. However, the actual sampling frequency is controlled by an adjustable-frequency digital clock, which is not infinitely variable and cannot be controlled with the requisite degree of precision to achieve an actual sampling frequency within the maximum permissible error from the desired frequency (e.g., ±0.03%). This is the problem addressed by the present invention, which reconstructs the original waveform and resamples the reconstructed waveform at the desired frequency when the actual sampling frequency is not within a preselected range of the desired frequency.

As an example, assume the measured power system frequency is 60 Hz, the A/D sample rate fs is 512*60 Hz=30720 Hz, and the clock frequency is 33.1776 MHz, or 16.5888 MHz when divided by two. In this case, N=16.5888 MHz/0.030720 MHz=540. Now suppose the system determines that it is time to update the frequency estimate. 16 cycles of data being sampled at 30720 Hz are placed in a buffer, and this buffered data is filtered to attenuate harmonics in order to accurately determine waveform zero-crossings. The buffer is searched for 12 consecutive negative-to-positive signal changes. At the first and last of these changes, an interpolation between the negative and positive samples is performed to determine the location of the zero-crossings. The number of samples between the first and the $12^{th}$ zero-crossing are counted. The intersample interval (1/fs) multiplied by this number is equal to the time contained in 11 cycles, so the frequency is: ((count of samples)/fs)/11. Now suppose this frequency is 59.9445 Hz. The required value for N would be (16.5888 MHz/(512*59.9445 Hz))=540.5. N must be an integer so it would be necessary to use 540 or 541. In either case the input waveform would not be synchronously sampled, and thus it is necessary to resample the data. Assume a value of 540 is chosen for N. In this example, fs=16.5888 MHz/540=30720.0 Hz, which produces an intersample interval o_isi of 1/30720.0 Hz=32.5521 us. The frequency fa2d to be compared with the measured frequency fmeas is 30720.0 Hz/512=60.0000 Hz.

Next suppose it is desired to perform an FFT to update the spectral data. Nine cycles of data being sampled at 30720.0 Hz are buffered and the frequency for eight cycles is determined in the same manner described above. This frequency will be 59.9445 Hz provided the frequency did not change. In this case, the variables in relation to the flowchart are: fmeas=59.9445 Hz, fa2d=60.0000 Hz, o_isi=32.5521 us, and r_isi=1/(512*59.9445 Hz)=32.5822 us.

Figure 4:
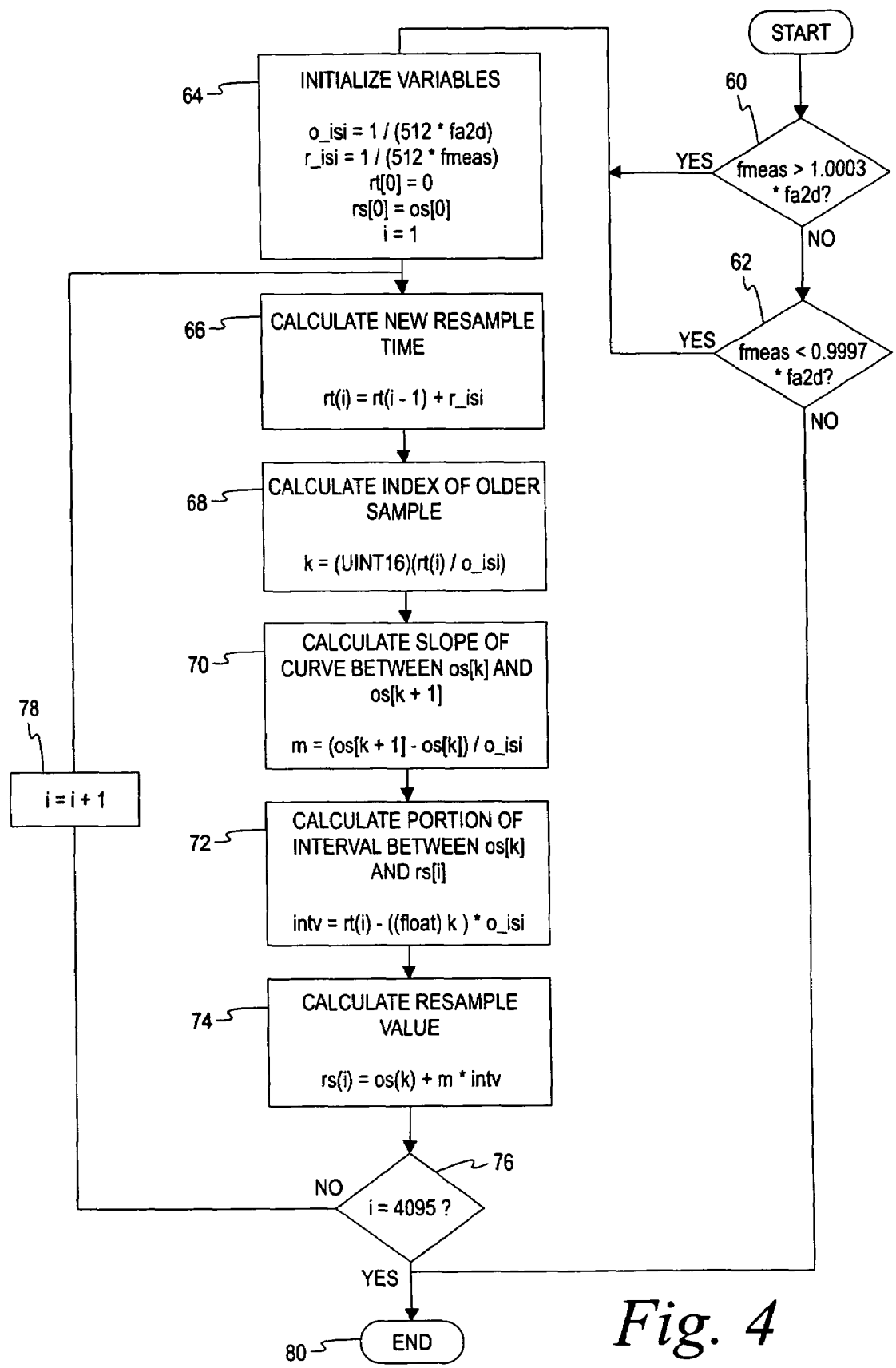
FIG. 4 is a flow chart of a data processing method implementing the present invention with linear interpolation.

Referring to the flow chart in FIG. 4, steps 60 and 62 determine whether the desired sampling frequency fmeas is more than 0.03% above the corresponding actual frequency fa2d. Specifically, step 60 determines whether the desired frequency fmeas is greater than 1.0003 times the fa2d. If the answer is positive, the system proceeds directly to step 64 to begin the resampling routine. If the answer at step 60 is negative, the system proceeds to step 62 to determines whether the desired frequency fmeas is less than 0.9997 times the actual frequency fa2d. If the answer is negative, then the actual frequency fa2d is within ±0.03% of the desired frequency fmeas, and the system proceeds directly to step 80 to bypass the resampling routine. If step 62 yields an affirmative answer, then the actual frequency fa2d is more than 0.03% below the desired frequency fmeas, and so the system proceeds to step 64 to initiate the resampling routine.

At step 64, variables used in the resampling process are initialized. The specific variables initialized and their respective initialized values are as follows:

| Variable | Initialized Value |
| --- | --- |
| Original (actual) intersample interval o_isi | 1/(512 * fa2d) |
| Desired intersample interval r_isi | 1/(512 * fmeas) |
| Resample starting time rt[0] | 0 |
| Resample value at time zero rs[0] | os[0] |
| Index number i | 1 |

The above values assume that 512 samples are taken during each cycle of the fundamental voltage signal.

Following the initialization step 64, the system proceeds to step 66 to calculate the new resampling time, or "running time," rt(i)=rt(i−1)+r_isi. That is, each new resample time rt(i) is the immediately preceding resample time plus the desired intersample interval r_isi, so that the resampling will proceed at the desired intersample intervals r_isi.

Step 68 calculates an index k which is an integer produced by truncating the ratio rt(i)/o_isi to an integer. Specifically, k is a 16-bit unsigned integer obtained by truncating the ratio rt(i)/o_isi, as indicated at step 68 in FIG. 4. The ratio rt(i)/o_isi represents the number of original intersample intervals o_isi included within the current resampling time rt(i).

After calculating the value of k at step 68, the system proceeds to step 70 to calculate the slope m of the curve between os[k] and os[k+1], which is defined by the equation m=Δy/Δx=Δvolts/Δtime=(os[k+1]−os[k])/o_isi. The same operation can be performed on a current waveform. Next, the portion intv of the interval between os[k] and rs[i] is calculated at step 72 as intv=rt(i)−((float)k)*o_isi. The two values m and intv are then used at step 74 to calculate the resample value rs(i), which is defined by the equation rs(i)=os(k)+(m*intv). Three resampled values RS(0), RS(1) and RS(2) are illustrated in FIG. 3. It can be seen that the time intervals between the resampled values RS(i) are greater than the intervals between original sampled values OS(i), which has the effect of making the resampling rate substantially the same as the desired sampling rate fmeas.

Following calculation of the resample value rs(i) at step 74, the system determines whether i has reached a preselected number, which is 4095 in the illustrative example. As long as the answer at step 76 is negative, the system recycles through step 78, which increments I by one, to step 66 to repeat the routine that results in the calculation of another resample value. When step 74 ultimately yields an affirmative answer, the system exits the routine at step 80.

Figure 5:
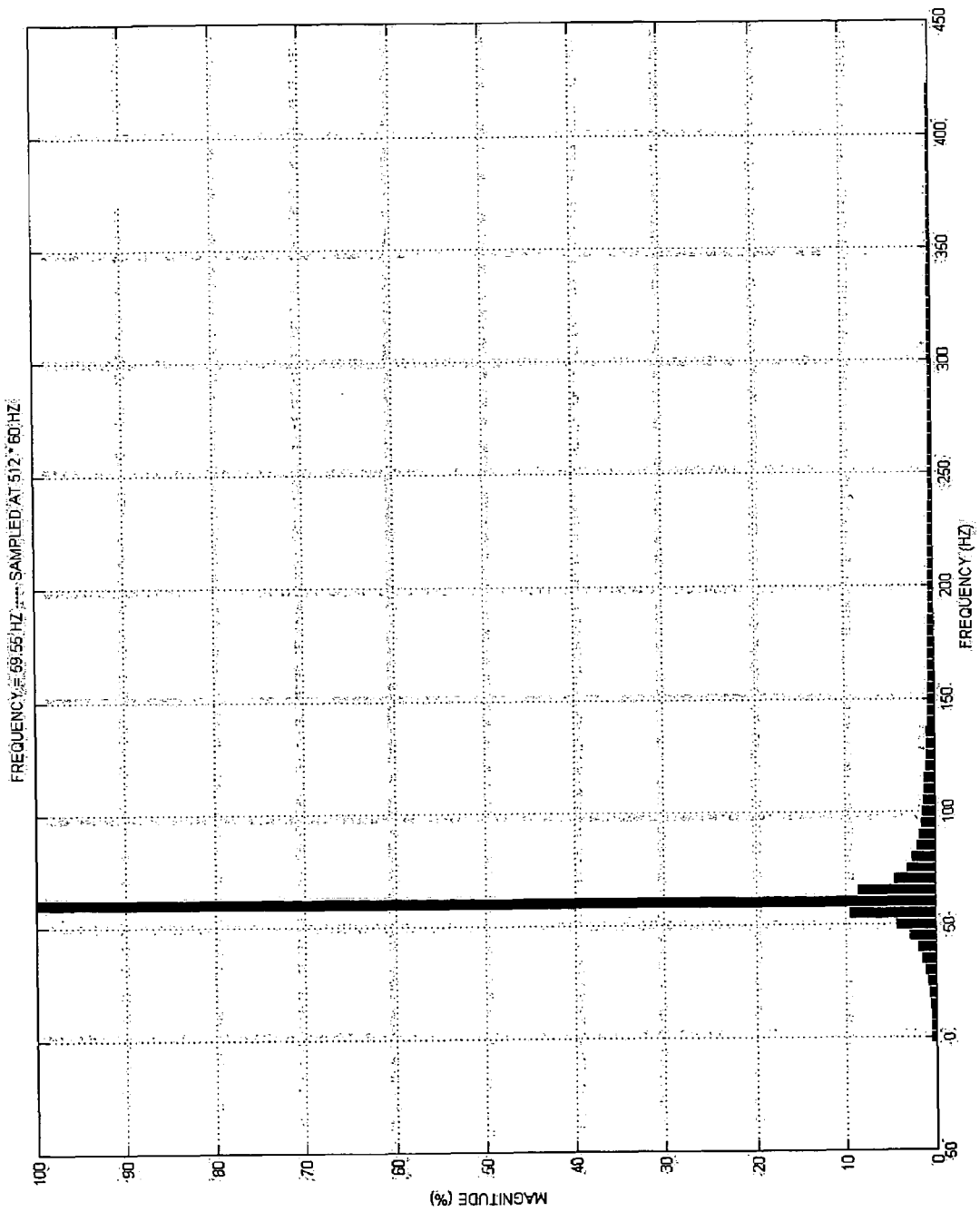
FIGS. 5 and 6 are graphs of the spectral content identified for a power signal having a measured frequency of 59.55 Hz and sampled at a multiple of 60 Hz.
Figure 6:
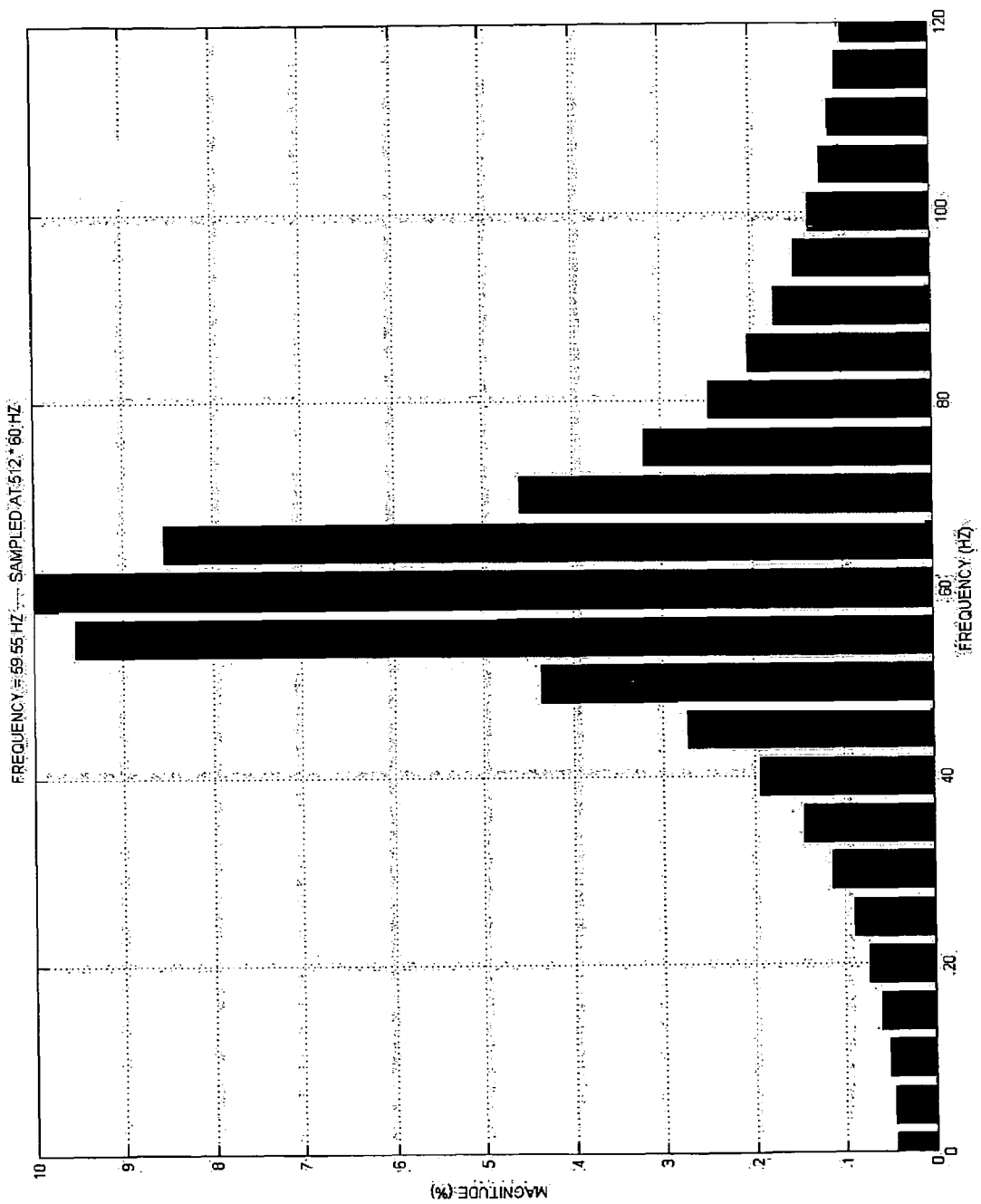

FIGS. 5 and 6 illustrate a case where the measured frequency fmeas is 59.55 Hz, but due to hardware limitations the actual sampling rate fs was 512 times 60 Hz, or 30,720 samples/second (30.72 kHz). FIGS. 5 and 6 are graphs showing the resulting spectrum for this case. Ideally, there would be only one spectral component at 59.55 Hz. However, it can be seen that the sidelobe at 55 Hz has a magnitude of approximately 9.5% of the input signal magnitude. In addition, there are other spectral components of significant magnitude both above and below the main component. It should also be noted that the main component is reported as being at 60 Hz rather than 59.55 Hz.

Figure 7:
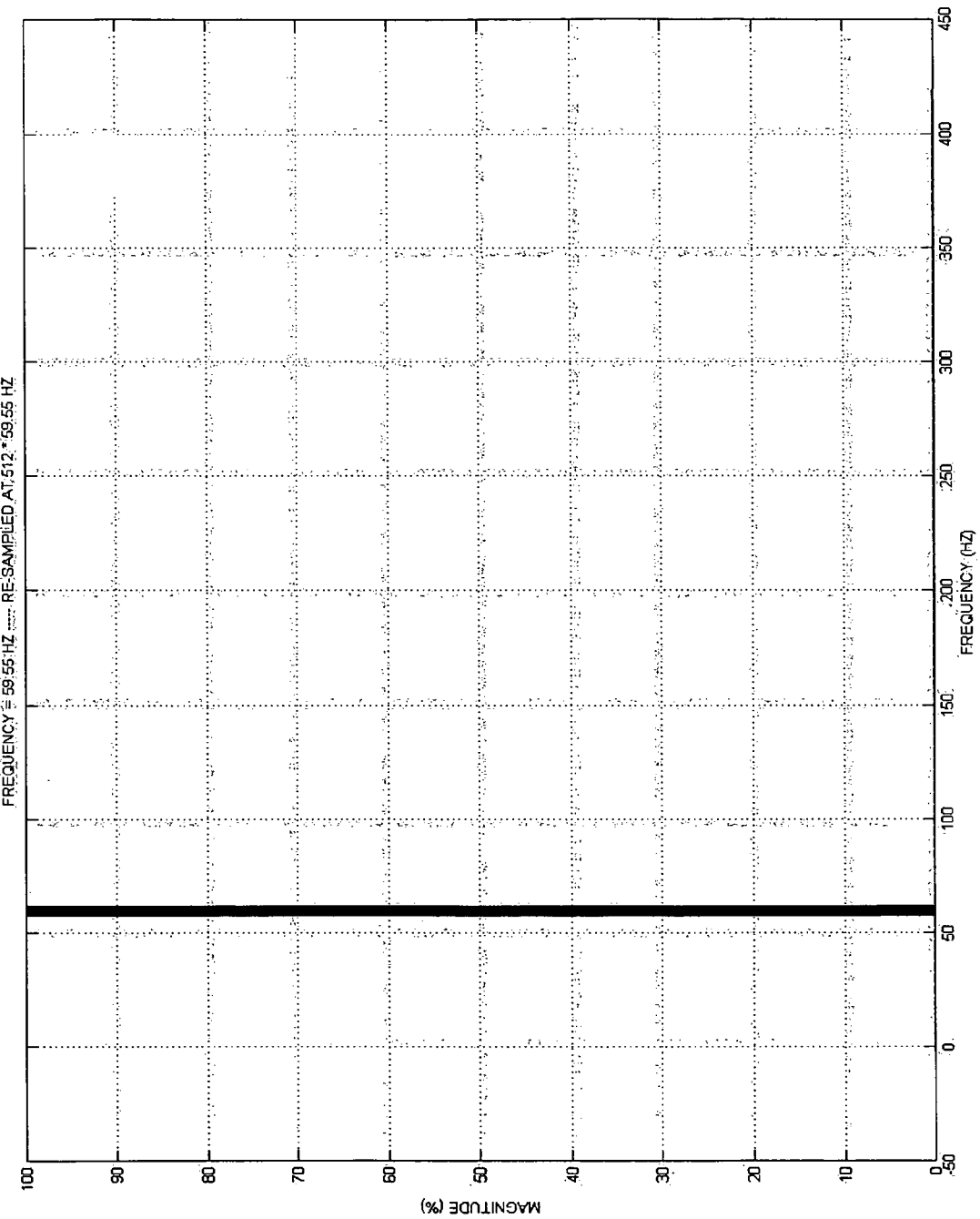
FIGS. 7 and 8 are graphs of the spectral content identified by reconstructing and resampling the power signal used to produce the results shown in FIGS. 5 and 6.
Figure 8:
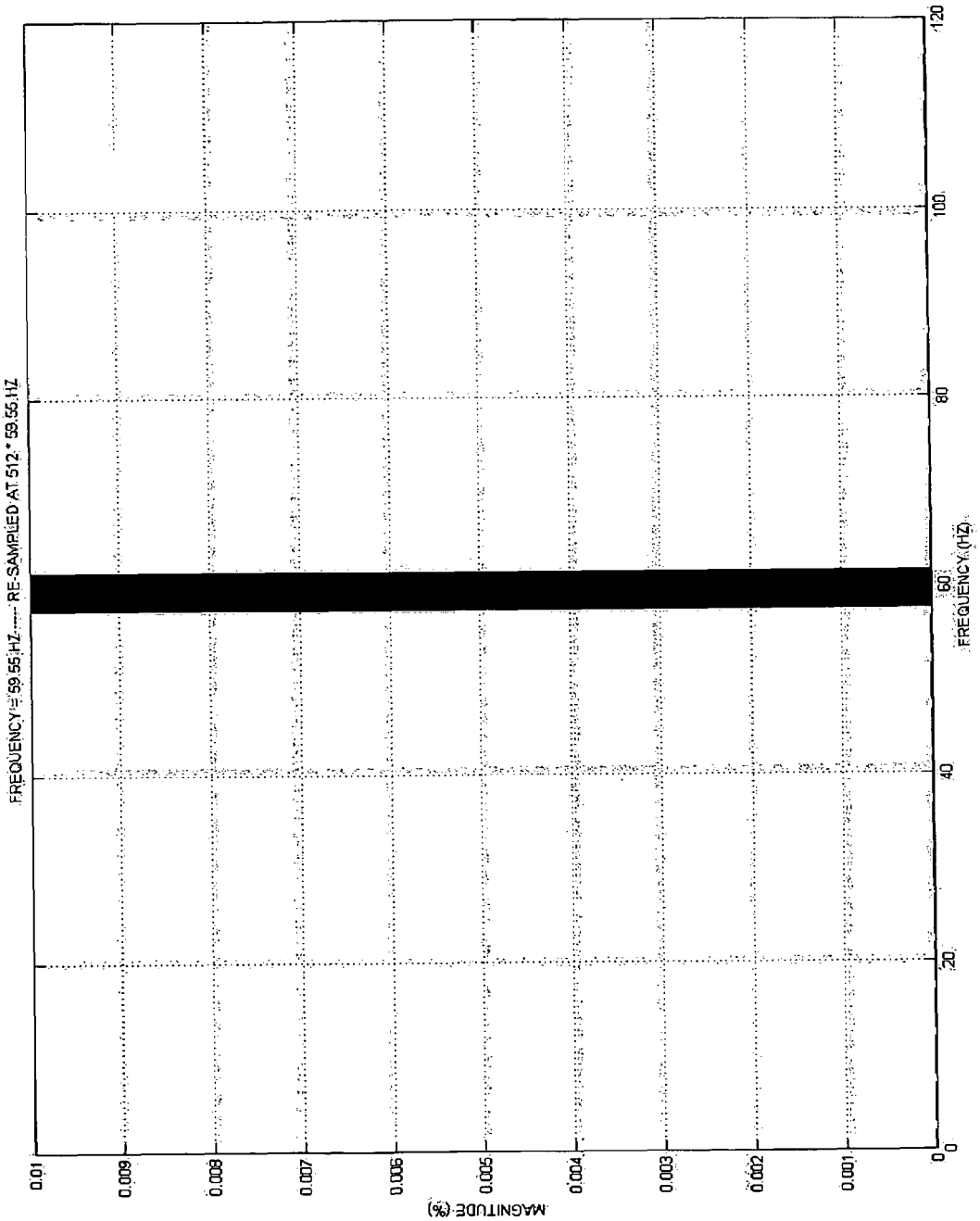

FIGS. 7 and 8 represent the corresponding situation after the input waveform has been resampled. By examining the chart in FIG. 8, it may be seen that all spectral components are now well below 0.001% of the input magnitude. The main spectral component is at 59.55 Hz even though it appears to be at 60.00 Hz due to the width of the bar used for plotting.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

The invention claimed is:

1. A digital power metering process for reducing spectral leakage when determining the frequencies present in a power signal by a technique that includes sampling said signal and performing a transformation from the time domain to the frequency domain, said process comprising measuring the fundamental frequency of said power signal, sampling said power signal at a known sampling rate to produce digital sample values representing said signal, determining whether said known sampling rate is within a preselected range of a rate that is coherent with the measured fundamental frequency, and if the answer is negative then resampling said signal at a rate that is coherent with said measured fundamental frequency to produce resample values representing said signal, so that the frequencies present in said power signal can be determined from said resample values.

2. The digital power metering process of claim 1 wherein said sampling of said power signal is effected by an A/D converter.

3. The digital power metering process of claim 1 wherein said resampling is effected by interpolation.

4. The digital power metering process of claim 1 wherein said resampling is effected by linear interpolation.

5. The digital power metering process of claim 1 wherein said resampling includes reconstructing said power signal and then resampling the reconstructed waveform.

6. The digital power metering process of claim 1 which includes determining the frequencies present in said power signal by use of said resample values in a Fast Fourier Transform (FFT).

7. A digital power metering system for reducing spectral leakage when determining the frequencies present in a power signal by a technique that includes sampling said signal and performing a transformation from the time domain to the frequency domain, said system comprising a microprocessor programmed to measure the fundamental frequency of said power signal, sample said power signal at a known sampling rate to produce digital sample values representing said signal, determine whether said known sampling rate is within a preselected range of a rate that is coherent with the measured fundamental frequency, and if the answer is negative then resample said signal at a rate that is coherent with said measured fundamental frequency to produce resample values representing said signal, so that the frequencies present in said power signal can be determined from said resample values.

8. The digital power metering system of claim 7 which includes an A/D converter for sampling of said power signal.

9. The digital power metering system of claim 7 wherein said microprocessor is programmed to resample by interpolation.

10. The digital power metering system of claim 7 wherein said microprocessor is programmed to resample by linear interpolation.

11. The digital power metering system of claim 7 wherein said microprocessor is programmed to resample by reconstructing the waveform of said power signal and then resampling the reconstructed waveform.

12. The digital power metering system of claim 7 wherein said microprocessor is programmed to determine the frequencies present in said power signal by use of said resample values in a Fast Fourier Transform (FFT).

* * * * *